(12) United States Patent
Lee

(10) Patent No.: US 8,689,857 B2
(45) Date of Patent: Apr. 8, 2014

(54) COMBINATION HEAT SINK

(75) Inventor: Chi-Ming Lee, Sinjhuang (TW)

(73) Assignee: Asia Vital Components Co., Ltd., New Taipei (TW)

( * ) Notice: Subject to any disclaimer, the term of this patent is extended or adjusted under 35 U.S.C. 154(b) by 544 days.

(21) Appl. No.: 12/499,223

(22) Filed: Jul. 8, 2009

(65) Prior Publication Data

US 2011/0005740 A1    Jan. 13, 2011

(51) Int. Cl.
    *F28F 7/00*    (2006.01)
    *H05K 7/20*    (2006.01)

(52) U.S. Cl.
    USPC .................. 165/80.3; 165/185; 361/703

(58) Field of Classification Search
    USPC ........... 165/80.3, 185; 361/704, 703; 257/722
    See application file for complete search history.

(56) References Cited

U.S. PATENT DOCUMENTS

| | | | |
|---|---|---|---|
| 3,312,277 A * | 4/1967 | Chitouras et al. | 165/185 |
| 4,669,535 A * | 6/1987 | Seidler | 165/78 |
| 6,009,938 A * | 1/2000 | Smith et al. | 165/185 |
| 6,446,709 B1 * | 9/2002 | Huang | 165/80.3 |
| 6,493,227 B2 * | 12/2002 | Nielsen et al. | 361/703 |
| 7,142,428 B2 | 11/2006 | Vackar | |
| 7,231,963 B2 * | 6/2007 | Lee et al. | 165/104.33 |
| 7,489,513 B2 * | 2/2009 | Lai et al. | 361/710 |
| 7,612,992 B2 * | 11/2009 | Chen | 361/679.31 |
| 2003/0155110 A1 * | 8/2003 | Joshi et al. | 165/185 |
| 2006/0060328 A1 * | 3/2006 | Ewes et al. | 165/80.2 |
| 2008/0111233 A1 * | 5/2008 | Pendse | 257/712 |

* cited by examiner

*Primary Examiner* — Allen Flanigan
*Assistant Examiner* — Jason Thompson

(57) ABSTRACT

A combination heat sink including a first radiating element having a first plane section and a second radiating element having a second plane section. Multiple first radiating fins integrally upward extend from the first plane section. Each two adjacent first radiating fins define therebetween a first connection section. Multiple second radiating fins integrally upward extend from the second plane section. Each two adjacent second radiating fins define therebetween a second connection section. The first and second radiating elements are connected with each other in an alternating manner with the first radiating fins attaching to and contacting with the second radiating fins to form the heat sink.

9 Claims, 6 Drawing Sheets

COMBINATION HEAT SINK

FIELD OF THE INVENTION

The present invention relates to a combination heat sink, and more particularly to a combination heat sink, which is made by means of the same mold so that the cost for developing the molds can be reduced. In addition, the combination heat sink can be easily assembled in a limited space to provide the same heat dissipation area.

BACKGROUND OF THE INVENTION

Following the rapid advance of modern technologies and industries, more and more sophisticated and high-power products have been developed. In operation, the high-power product will inevitably generate high heat to cause rise of temperature. In the case that the heat accumulates to an extent higher than a tolerable limit, the electronic components of the product may burn out to result in crash of the product. In some more serious cases, greater damage may be incurred. Therefore, most of the sophisticated products are equipped with heat sinks for dissipating the heat generated by the products.

Also, it is known that the electronic components and the heat sink of an electronic device are generally arranged in a quite limited space. In this case, the heat sink can only provide limited heat dissipation area so that the heat dissipation effect is poor. In addition, the parts of the existent heat sink are made by means of different molds so that the manufacturing cost is relatively high. Furthermore, the parts are assembled in the limited space of the electronic device. Such assembling procedure is troublesome.

Moreover, for achieving visual effect, some manufacturers will add colorful accessories to the heat sinks or spray the heat sinks with colorful paints to promote the appearances thereof. However, after adding the accessories to the heat sinks or spraying the heat sinks, the heat dissipation effect thereof will be greatly deteriorated.

SUMMARY OF THE INVENTION

A primary object of the present invention is to provide a combination heat sink, which is made at lower cost and can be easily and quickly assembled in a limited space to provide the same heat dissipation effect.

A further object of the present invention is to provide the above combination heat sink, which has a good visual effect, while keeping optimal heat dissipation effect.

To achieve the above and other objects, the combination heat sink of the present invention includes a first radiating element and a second radiating element. The first radiating element has a first plane section on one side. Multiple first radiating fins integrally upward extend from the first plane section. Each two adjacent first radiating fins define therebetween a first connection section. The second radiating element has a second plane section on one side. Multiple second radiating fins integrally upward extend from the second plane section. Each two adjacent second radiating fins define therebetween a second connection section. The first and second radiating elements are connected with each other in an alternating manner with the first and second plane sections attaching to each other. The first radiating fins of the first radiating element are connected with the second connection sections of the second radiating element, while the second radiating fins of the second radiating element are connected with the first connection sections of the first radiating element. Accordingly, the combination heat sink can be easily assembled in a limited space to provide the same heat dissipation area. Also, the cost for developing the molds can be reduced.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
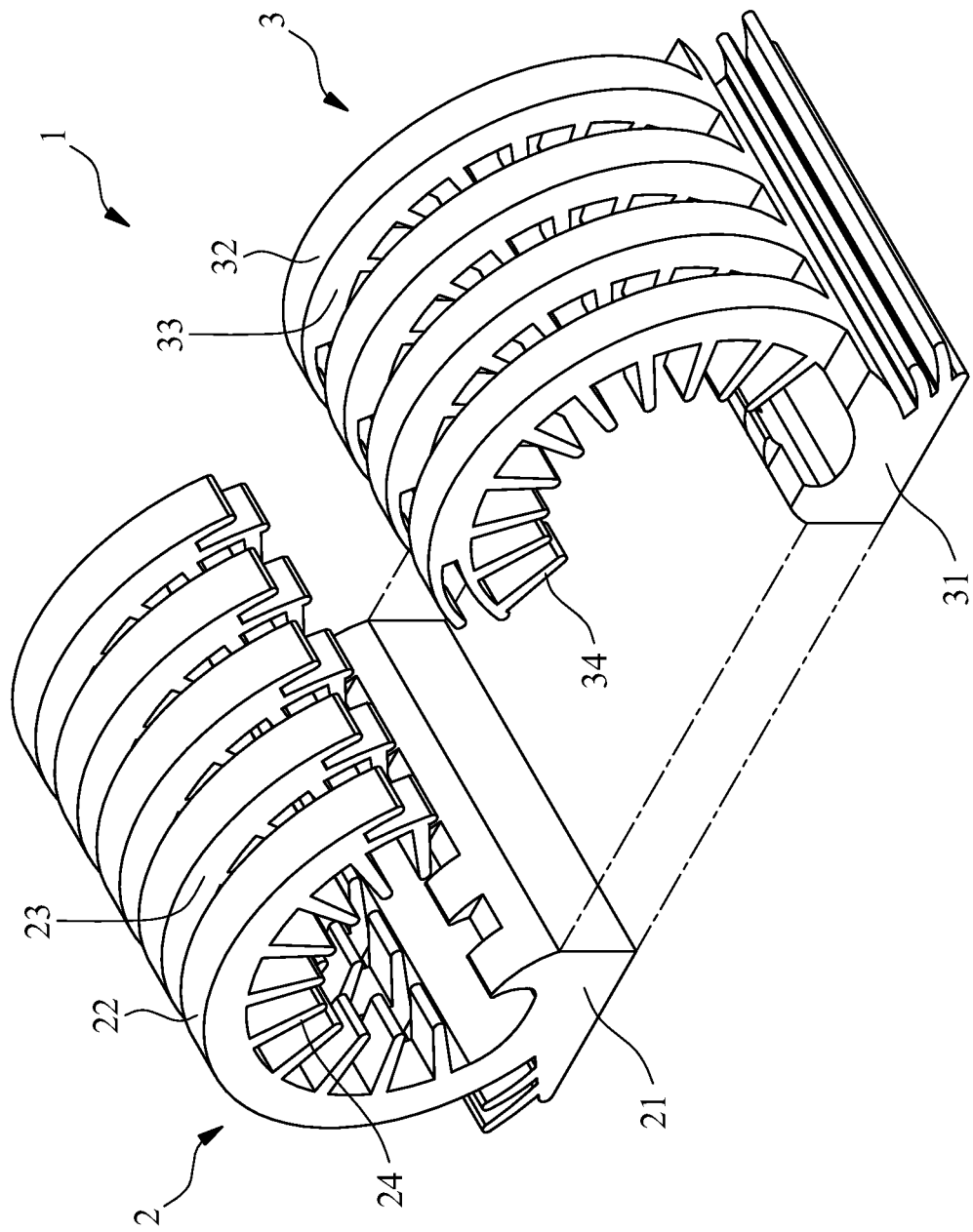
FIG. 1 is a perspective exploded view of a first embodiment of the present invention.
Figure 2:
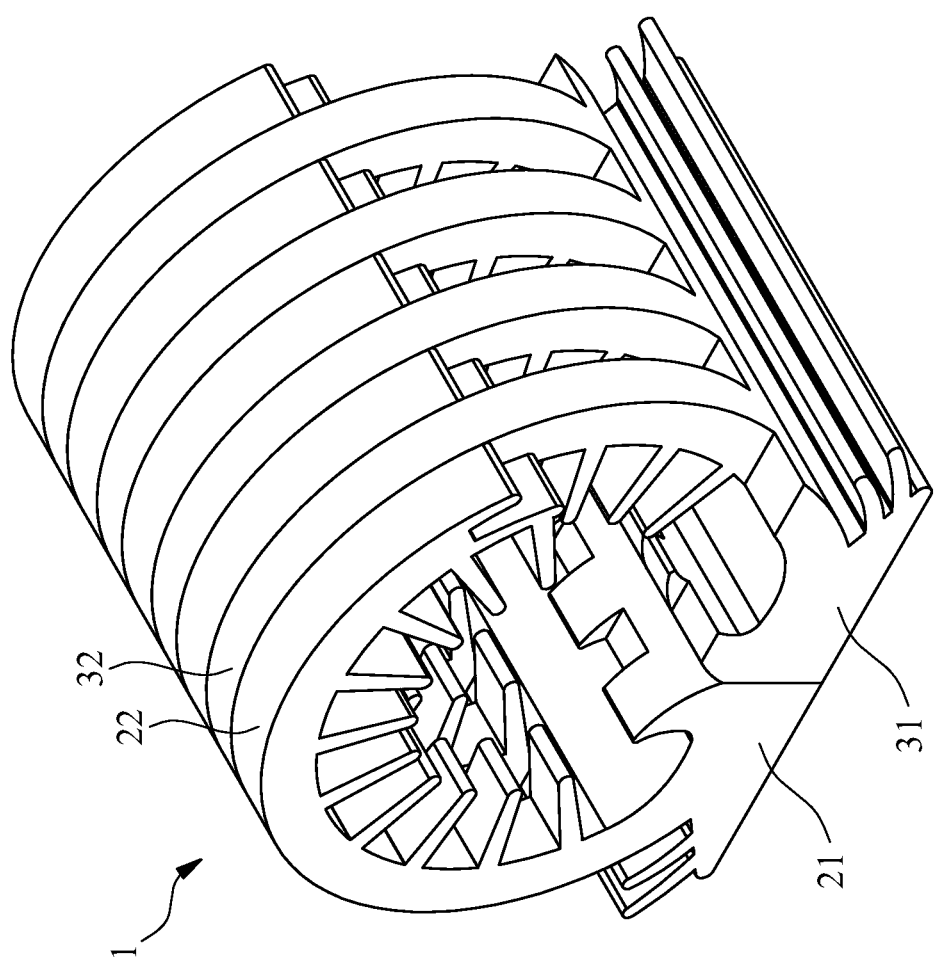
FIG. 2 is a perspective assembled view of the first embodiment of the present invention.
Figure 3:
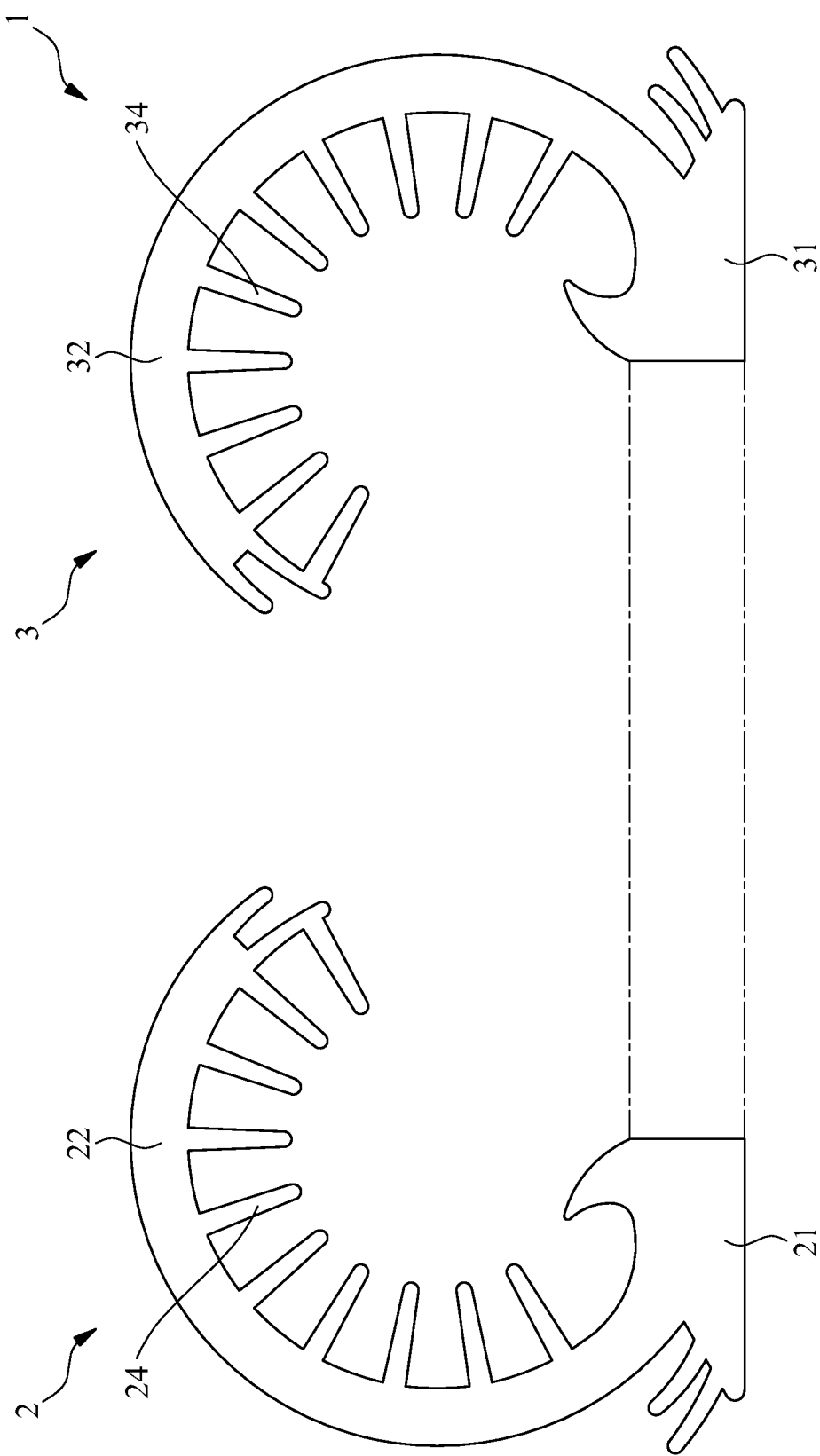
FIG. 3 is a side view of the first embodiment of the present invention.

Please refer to FIGS. 1, 2 and 3. According to a first embodiment, the heat sink 1 of the present invention includes a first radiating element 2 and a second radiating element 3. The first and second radiating elements 2 and 3 are made by means of the same mold. The first radiating element 2 has a first plane section 21 on one side. Multiple generally circular first radiating fins 22 integrally upward extend from the first plane section 21. The first radiating fins 22 are side by side arranged. Each two adjacent first radiating fins 22 define therebetween a first connection section 23. The second radiating element 3 has a second plane section 31 on one side. Multiple generally circular second radiating fins 32 integrally upward extend from the second plane section 31. The second radiating fins 32 arc side by side arranged. Each two adjacent second radiating fins 32 define therebetween a second connection section 33. The first and second radiating elements 2, 3 are horizontally connected with each other in an alternating manner. When the first and second radiating elements 2, 3 are connected, the first and second plane sections 21, 31 horizontally attach to each other. Under such circumstance, the first radiating fins 22 of the first radiating element 2 are inserted into the second connection sections 33 of the second radiating element 3, while the second radiating fins 32 of the second radiating element 3 are inserted into the first connection sections 23 of the first radiating element 2. The first radiating fin 22 has a width adapted to that of the second connection section 33 and the second radiating fin 32 has a width adapted to that of the first connection section 23. Accordingly, the first radiating fins 22 are tightly fitted in the second connection sections 33 and the second radiating fins 32 are tightly fitted in the first connection sections 23. In this case, the first radiating element 2 can be securely assembled with the second radiating element 3 with the first radiating fins 22 attaching to and contacting with the second radiating fins 32 to form a heat sink 1 having a partially enclosed space. Accordingly, the heat sink 1 can be easily assembled and have the same heat dissipation area. In addition, the first radiating element 2 has multiple first enhancement heat dissipation sections 24 extending from inner sides of the first radiating fins 22. The second radiating element 3 has multiple second enhancement heat dissipation sections 34 extending from inner sides of the second radiating fins 32. The first and second enhancement heat dissipation sections 24, 34 extend into the partially enclosed space and serve to enhance heat dissipation effect of the heat sink 1 and improve visual effect of the heat sink 1. The first and second radiating elements 2, 3 can be made of different heat conduction materials. For example, the first radiating element 2 can be made of copper, while the second radiating element 3 can be made of aluminum. Alternatively, the first and second radiating elements 2, 3 can be made of the same heat conduction material.

Figure 4:
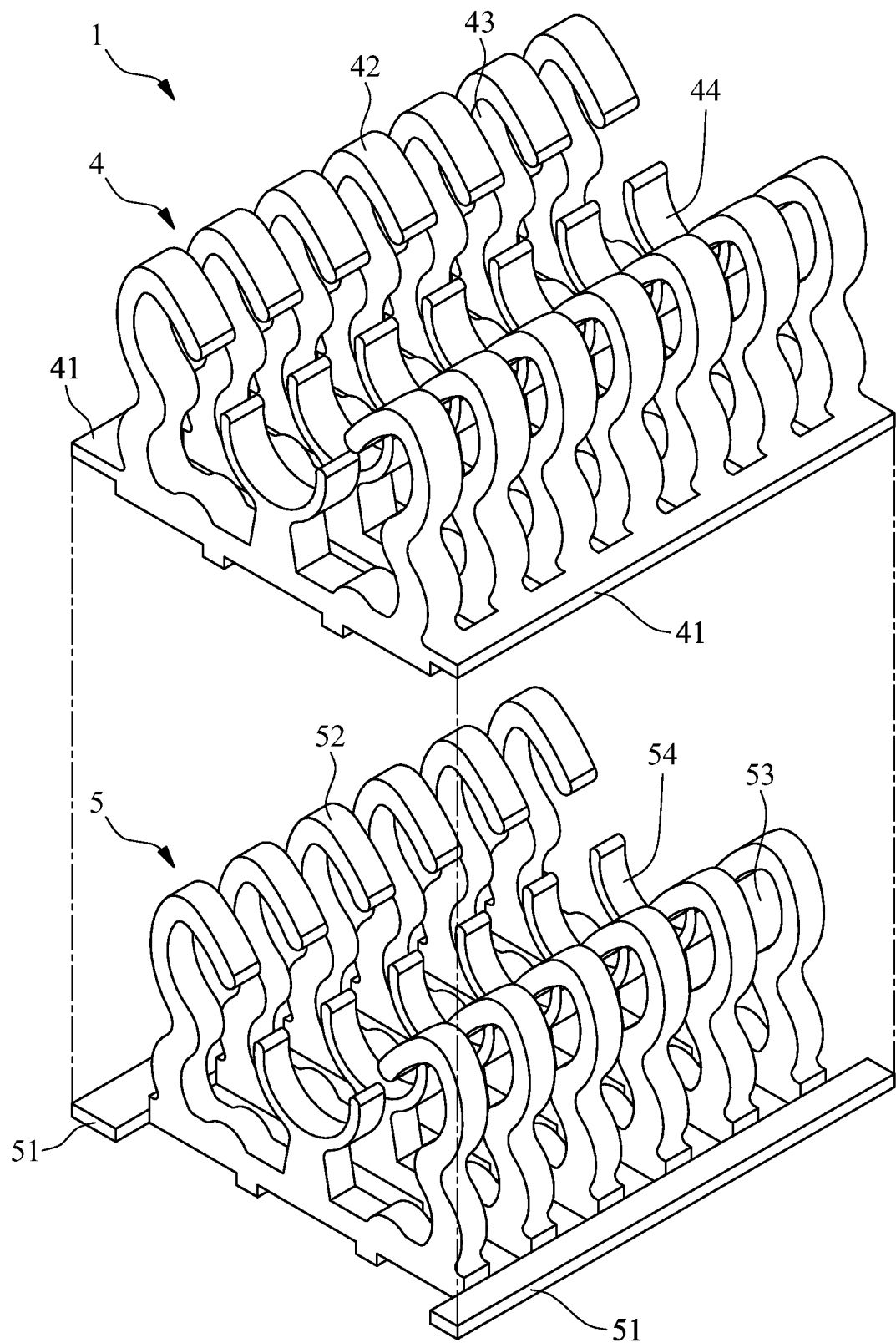
FIG. 4 is a perspective exploded view of a second embodiment of the present invention.
Figure 5:
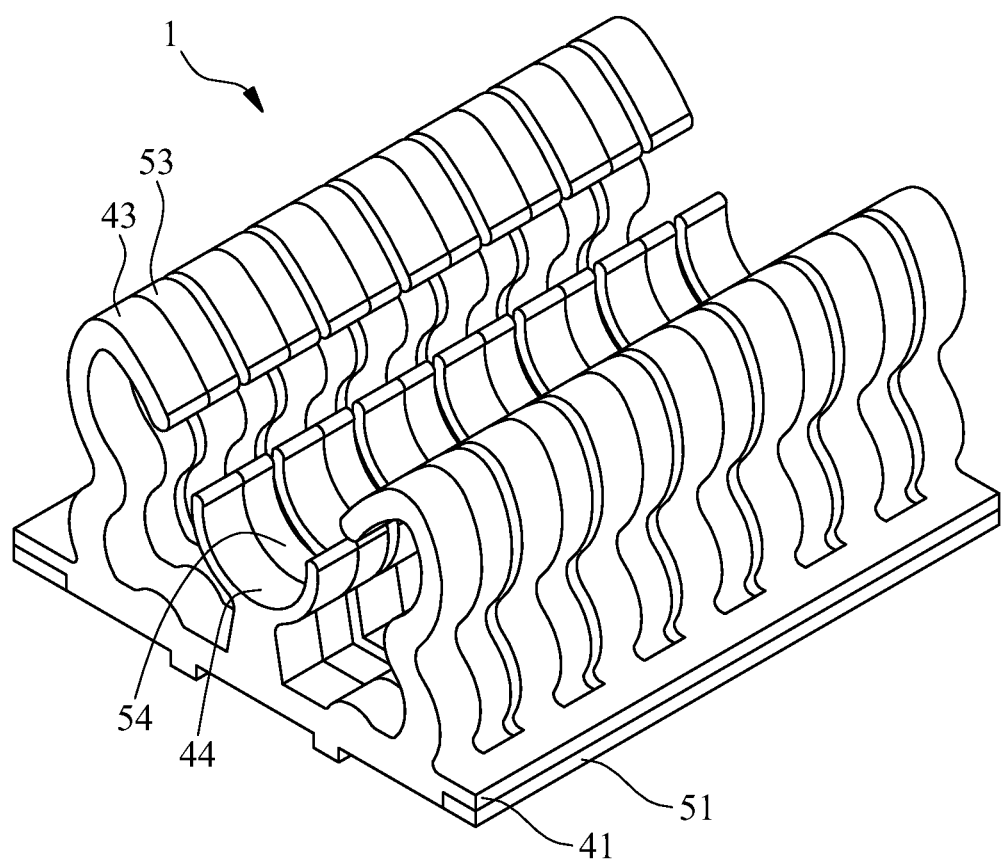
FIG. 5 is a perspective assembled view of the second embodiment of the present invention.
Figure 6:
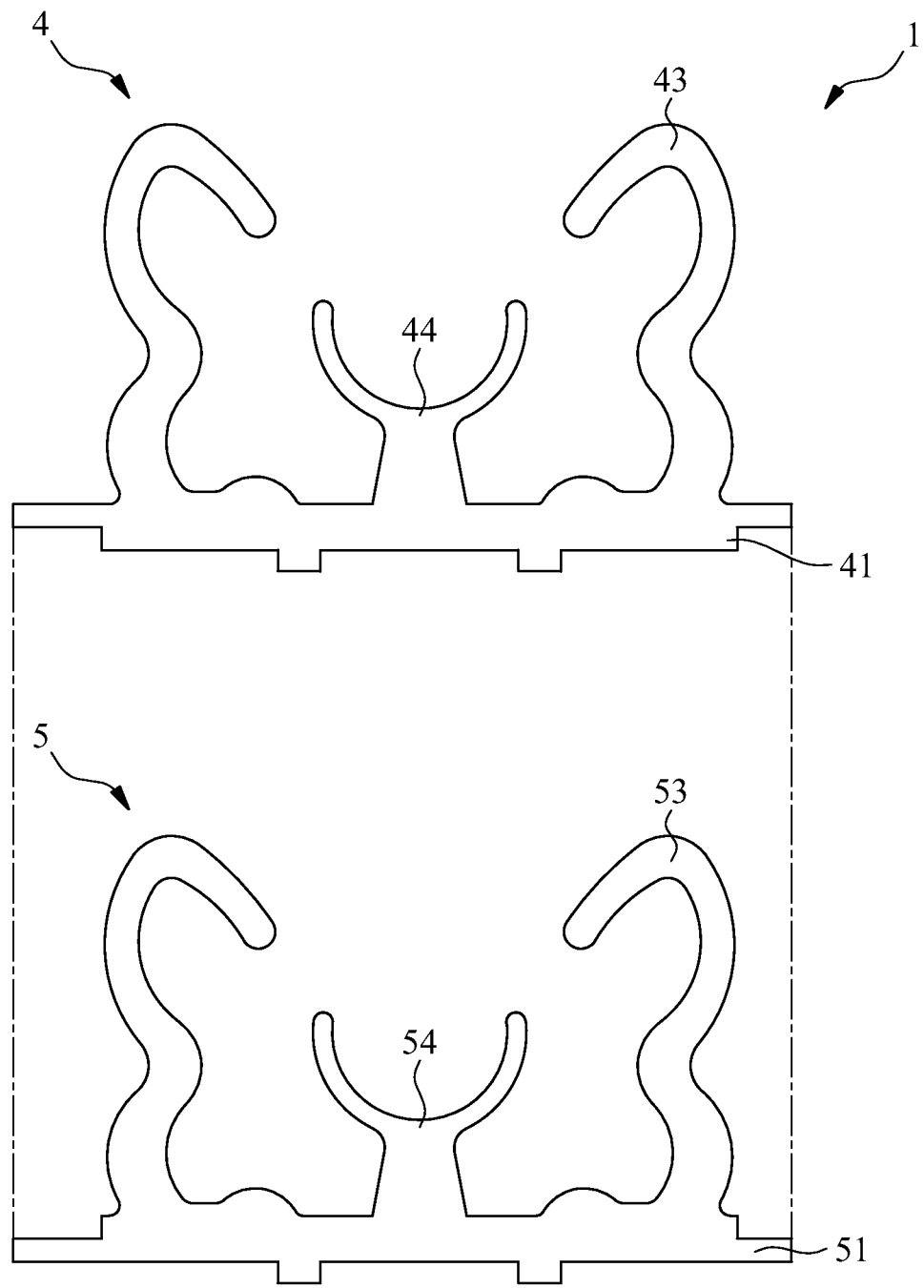
FIG. 6 is a side view of the second embodiment of the present invention.

Please refer to FIGS. 4, 5 and 6, which show a second embodiment of the heat sink 1 of the present invention. The heat sink 1 includes a first radiating element 4 and a second radiating element 5. The first and second radiating elements 4 and 5 are made by means of two molds. The first radiating element 4 has two first plane sections 41 on two sides respectively. Multiple first radiating fins 42 inward extend from each of the first plane sections 41. The first radiating fins 42 are side by side arranged. Each two adjacent first radiating fins 42 define therebetween a first connection section 43. The second radiating element 5 has two second plane sections 51 on two sides respectively. Multiple second radiating fins 52 inward extend from each of the second plane sections 51. The second radiating fins 52 are side by side arranged. Each two adjacent second radiating fins 52 define therebetween a second connection section 53. The first and second radiating elements 4, 5 are vertically connected with each other in an alternating manner. When the first and second radiating elements 4, 5 are connected, the first and second plane sections 41, 51 vertically attach to and complimentarily engage with each other. Under such circumstance, the first radiating fins 42 of the first radiating element 4 are inserted into the second connection sections 53 of the second radiating element 5, while the second radiating fins 52 of the second radiating element 5 are inserted into the first connection sections 43 of the first radiating element 4. In this case, the first radiating element 4 can be securely assembled with the second radiating element 5 with the first radiating fins 42 attaching to and contacting with the second radiating fins 52 to form the heat sink 1. Accordingly, the heat sink 1 can be easily assembled and have the same heat dissipation area. In addition, the first radiating element 4 has multiple first enhancement heat dissipation sections 44 extending from an inner side of the first radiating element 4. The second radiating element 5 has multiple second enhancement heat dissipation sections 54 extending from an inner side of the second radiating element 5. The first and second enhancement heat dissipation sections 44, 54 serve to enhance heat dissipation effect of the heat sink I and improve visual effect of the heat sink 1. The first and second radiating elements 4, 5 can be made of different heat conduction materials. For example, the first radiating element 4 can be made of copper, while the second radiating element 5 can be made of aluminum. Alternatively, the first and second radiating elements 4, 5 can be made of the same heat conduction material.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A combination heat sink comprising:
a first radiating element having a first plane section on one side, multiple generally circular first radiating fins integrally upward extending from the first plane section and multiple spaced first enhancement heat dissipation sections extending from an inner side of the first radiating element, each two adjacent first radiating fins defining therebetween a first connection section;
a second radiating element having a second plane section on one side, multiple generally circular second radiating fins integrally upward extending from the second plane section and multiple spaced second enhancement heat dissipation sections extending from an inner side of the second radiating element, each two adjacent second radiating fins defining therebetween a second connection section, the first radiating fins having a width adapted to that of the second connection sections and the second radiating fins having a width adapted to that of the first connection sections, the first and second radiating elements being connected with each other in an alternating manner with the first and second plane sections attaching to each other and portions of the first and second enhancement heat dissipation sections interspersed between each other in an alternating manner to enhance the heat dissipation effect, whereby the first radiating fins of the first radiating element are configured to be inserted into and located within and in contact with the second connection sections of the second radiating element, while the second radiating fins of the second radiating element are configured to be inserted into and located within and in contact with the first connection sections of the first radiating element; and
wherein the first radiating element is securely assembled with the second radiating element with the first radiating fins attaching to and contacting with the second radiating fins to form a heat sink having a partially enclosed space, the enhancement heat dissipation section extending into the partially enclosed space.

2. The combination heat sink as claimed in claim 1, wherein the first and second radiating elements are vertically connected with each other in an alternating manner.

3. The combination heat sink as claimed in claim 1, wherein the first and second radiating elements are horizontally connected with each other in an alternating manner.

4. The combination heat sink as claimed in claim 1, wherein the first and second radiating elements are made by means of a common mold.

5. The combination heat sink as claimed in claim 1, wherein the first radiating fins are tightly fitted in the second connection sections.

6. The combination heat sink as claimed in claim 1, wherein the second radiating fins are tightly fitted in the first connection sections.

7. The combination heat sink as claimed in claim 1, wherein the first radiating element is made of copper, while the second radiating element is made of aluminum.

8. The combination heat sink as claimed in claim 1, wherein the first and second radiating elements are made of different heat conduction materials.

9. The combination heat sink as claimed in claim 1, wherein the first and second radiating elements are made of the same heat conduction material.

* * * * *